(12) United States Patent
Saenger et al.

(10) Patent No.: US 9,405,202 B2
(45) Date of Patent: Aug. 2, 2016

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Ingo Saenger, Heidenheim (DE); Christoph Hennerkes, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/737,965

(22) Filed: Jun. 12, 2015

(65) Prior Publication Data

US 2015/0277235 A1 Oct. 1, 2015

Related U.S. Application Data

(63) Continuation of application No. PCT/EP2014/050261, filed on Jan. 9, 2014.

(60) Provisional application No. 61/756,084, filed on Jan. 24, 2013.

(30) Foreign Application Priority Data

Jan. 24, 2013 (DE) .......................... 10 2013 201 133

(51) Int. Cl.
*G03B 27/28* (2006.01)
*G03B 27/54* (2006.01)
*G03F 7/20* (2006.01)

(52) U.S. Cl.
CPC ........ *G03F 7/70191* (2013.01); *G03F 7/70116* (2013.01); *G03F 7/70566* (2013.01)

(58) Field of Classification Search
CPC ............ G03F 7/70116; G03F 7/70191; G03F 7/70566
USPC .......................................... 355/53, 55, 67–71
See application file for complete search history.

(56) References Cited

U.S. PATENT DOCUMENTS

2005/0195480 A1* 9/2005 Brown ................. G02B 5/3083
359/489.07
2007/0195305 A1 8/2007 Mulder et al.
(Continued)

FOREIGN PATENT DOCUMENTS

DE 10 2010 029 339 A1 12/2011
DE 10 2010 029 905 A1 12/2011
(Continued)

OTHER PUBLICATIONS

The International Search Report and Written Opinion for corresponding PCT Appl No. PCT/EP2014/050261, dated May 20, 2014.
(Continued)

*Primary Examiner* — Hung Henry Nguyen
(74) *Attorney, Agent, or Firm* — Fish & Richardson P.C.

(57) ABSTRACT

The invention relates to an optical system of a microlithographic projection exposure apparatus, comprising at least one mirror arrangement having a plurality of mirror elements which are adjustable independently of one another for the purpose of changing an angular distribution of the light reflected by the mirror arrangement, and a polarization-influencing optical element, which generates, for impinging light having a constantly linear or a circular input polarization distribution, an output polarization distribution having a direction of polarization that varies continuously over the light beam cross section.

24 Claims, 13 Drawing Sheets

(56) References Cited

U.S. PATENT DOCUMENTS

| | | | |
|---|---|---|---|
| 2008/0192225 A1* | 8/2008 | Mann | G03F 7/70566 355/71 |
| 2009/0115989 A1 | 5/2009 | Tanaka | |
| 2010/0165318 A1 | 7/2010 | Fiolka et al. | |
| 2011/0228247 A1* | 9/2011 | Mulder | G03F 7/70116 355/71 |
| 2013/0050673 A1 | 2/2013 | Saenger et al. | |
| 2013/0077077 A1 | 3/2013 | Saenger et al. | |
| 2014/0233008 A1 | 8/2014 | Tanitsu et al. | |
| 2015/0029480 A1 | 1/2015 | Schlesener et al. | |

FOREIGN PATENT DOCUMENTS

| | | |
|---|---|---|
| DE | 102012205045 | 10/2013 |
| WO | WO 2005/026843 A2 | 3/2005 |
| WO | WO 2005/069081 A2 | 7/2005 |
| WO | WO 2011/147658 | 12/2011 |
| WO | WO 2011/154227 | 12/2011 |
| WO | WO 2012/169089 | 12/2012 |
| WO | WO 2013/14359 | 10/2013 |
| WO | WO 2013/143594 | 10/2015 |

OTHER PUBLICATIONS

International Preliminary Report on Patentability for corresponding International Application No. PCT/EP2014/050261, 7 pages, mailed Aug. 6, 2015.

German Office Action with English translation thereof for corresponding German Application No. 10 2013 201 133.4, 7 pages, dated Jul. 8, 2013.

Korean Notice of Reason for Rejection, with translation thereof, for corresponding KR Appl No. 10-2015-7017893, dated May 20, 2016.

Japanese Office Action, with transition thereof, for corresponding JP Appln No. 2015-554099, dated May 26, 2016.

* cited by examiner

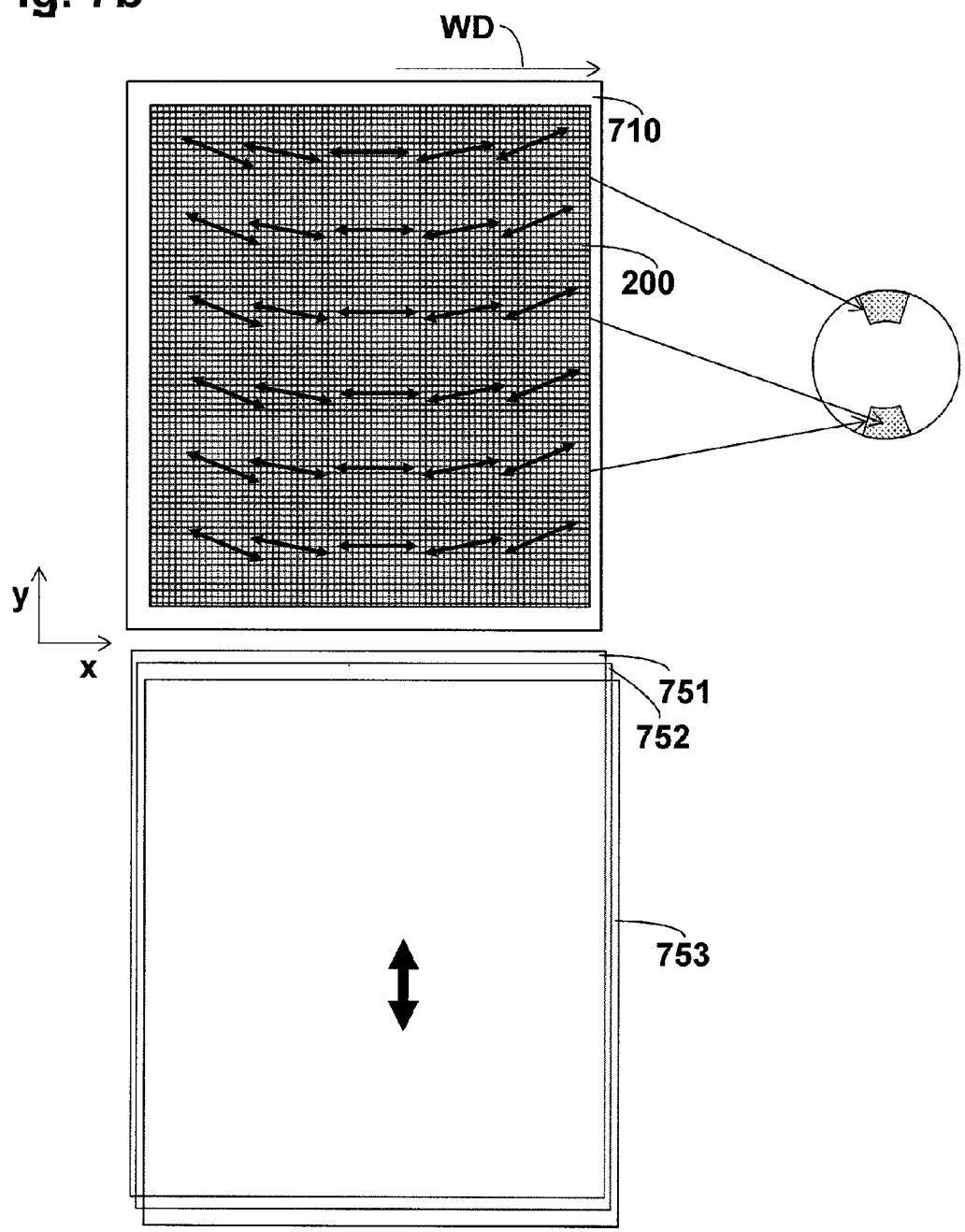

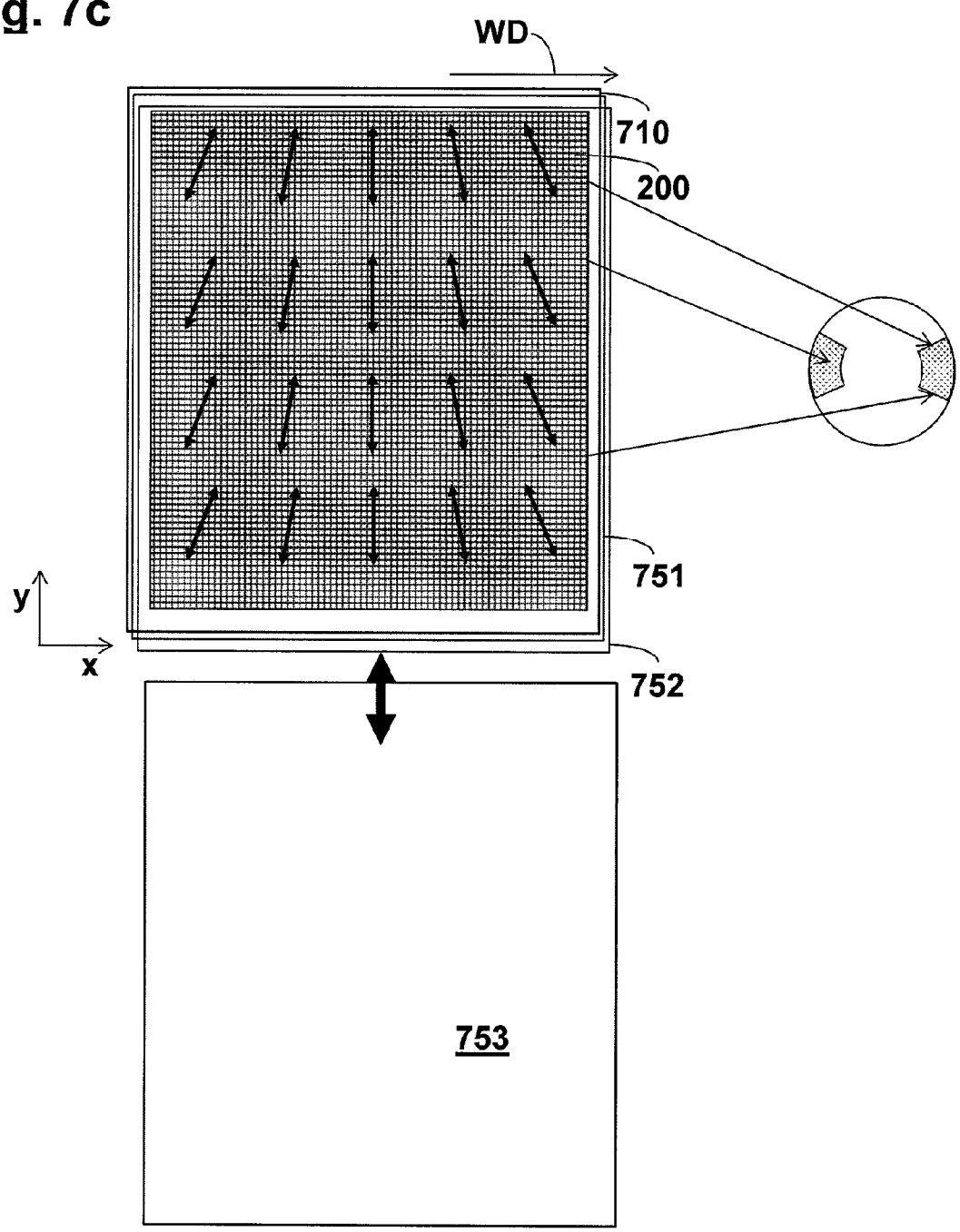

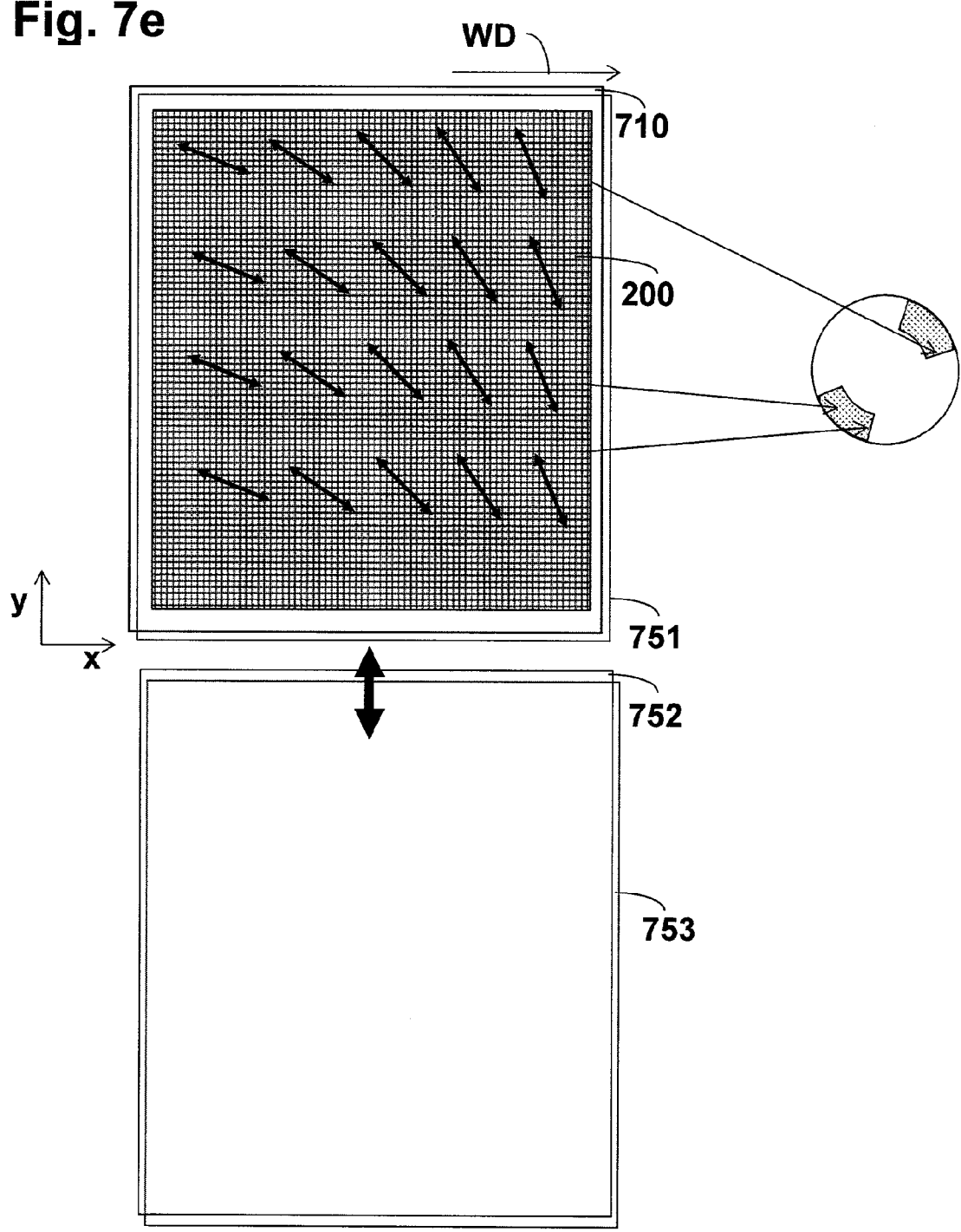

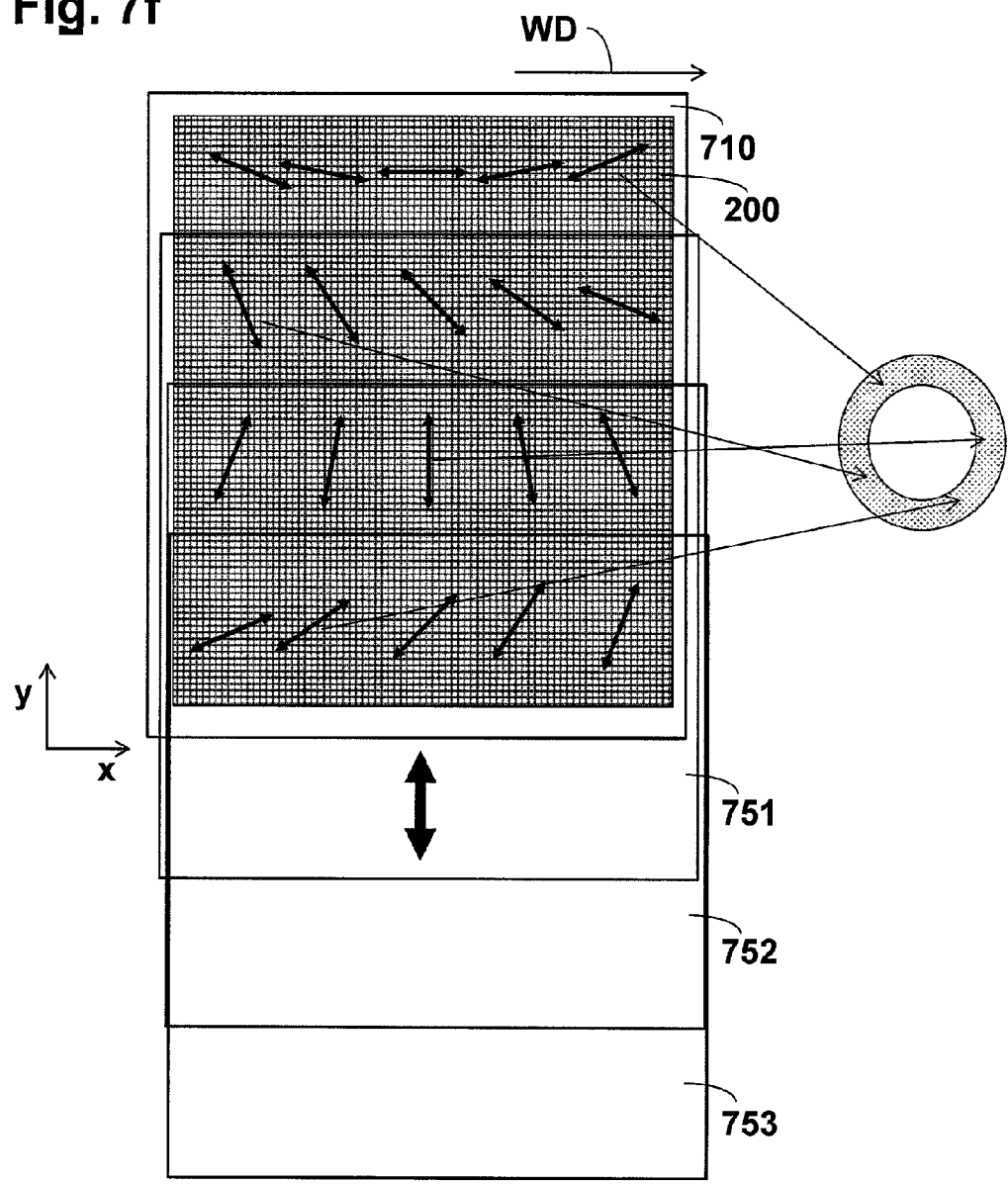

OPTICAL SYSTEM OF A MICROLITHOGRAPHIC PROJECTION EXPOSURE APPARATUS

REFERENCE TO RELATED APPLICATIONS

This application is a continuation of, and claims benefit under 35 USC 120 to, international application PCT/EP2014/050261, filed Jan. 9, 2014, which claims priority under 35 USC 119 of German Patent Application DE 10 2013 201 133.4 and U.S. 61/756,084, both filed on Jan. 24, 2013. The content of these applications are hereby incorporated by reference.

BACKGROUND OF THE INVENTION

1. Field of the Invention

The invention relates to an optical system of a microlithographic projection exposure apparatus. In particular, the invention relates to an optical system of a microlithographic projection exposure apparatus which enables an increased flexibility when providing a desired polarization distribution.

2. Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus there is a need to set defined illumination settings, i.e. intensity distributions in a pupil plane of the illumination device, in a targeted manner. For this purpose, besides the use of diffractive optical elements (so-called DOEs), the use of mirror arrangements is also known, e.g. from WO 2005/026843 A2. Such mirror arrangements comprise a multiplicity of micromirrors that can be set independently of one another.

Furthermore, various approaches are known for setting, in the illumination device, for the purpose of optimizing the imaging contrast, specific polarization distributions in the pupil plane and/or in the reticle in a targeted manner. In particular, it is known, both in the illumination device and in the projection lens, to set a tangential polarization distribution for high-contrast imaging. "Tangential polarization" (or "TE polarization") is understood to mean a polarization distribution in which the planes of vibration of the electric field strength vectors of the individual linearly polarized light rays are oriented approximately perpendicularly to the radius directed toward the optical system axis. By contrast, "radial polarization" or ("TM polarization") is understood to mean a polarization distribution in which the planes of vibration of the electric field strength vectors of the individual linearly polarized light rays are oriented approximately radially with respect to the optical system axis.

With regard to the prior art, reference is made for example to WO 2005/069081 A2, DE 10 2010 029 905 A1 and DE 10 2010 029 339 A1.

SUMMARY OF THE INVENTION

It is an object of the present invention to provide an optical system of a microlithographic projection exposure apparatus which makes it possible to provide a desired polarization distribution with comparatively little outlay.

This object is achieved via an optical system of a microlithographic projection exposure apparatus. The apparatus includes at least one mirror arrangement having a plurality of mirror elements which are adjustable independently of one another for the purpose of changing an angular distribution of the light reflected by the mirror arrangement. The apparatus also includes a polarization-influencing optical element, which generates, for impinging light having a constantly linear or a circular input polarization distribution, an output polarization distribution having a direction of polarization that varies continuously over the light beam cross section.

An optical system of a microlithographic projection exposure apparatus comprises:

at least one mirror arrangement having a plurality of mirror elements which are adjustable independently of one another for the purpose of changing an angular distribution of the light reflected by the mirror arrangement; and a polarization-influencing optical element, which generates, for impinging light having a constantly linear or a circular input polarization distribution, an output polarization distribution having a direction of polarization that varies continuously over the light beam cross section.

The invention is firstly based on the concept, in particular, of combining a mirror arrangement having mutually independently adjustable mirror elements with a continuously varying direction of polarization generated by a polarization-influencing optical element, with the consequence that for the individual "light channels" directed by the mirror elements of the mirror arrangement into a downstream plane (in particular a pupil plane of the optical system), in accordance with the respective polarization-influencing effect of the polarization-influencing optical element for the relevant light channel, a corresponding polarization state is set. In this case, the polarization-influencing optical element itself can be embodied comparatively simply from the standpoint of production engineering, wherein, in particular, thickness profiles that are complicated to produce can be avoided. Furthermore, interspaces present in segmented polarization-influencing optical elements and problems that result therefrom, such as e.g. loss of light, can be avoided.

In accordance with one embodiment, the polarization-influencing optical element has a plane-parallel geometry, which has the advantage of particularly simple and thus comparatively cost-effective producibility.

In accordance with one embodiment, the polarization-influencing optical element has linear birefringence having a direction of the fast axis of birefringence that varies over the optically effective surface.

In accordance with one embodiment, the optical system has an optical system axis, wherein the direction of the fast axis of birefringence of the polarization-influencing optical element varies in an azimuthal direction with respect to the optical system axis.

In accordance with one embodiment, the polarization-influencing optical element has a retardation that is constant in terms of absolute value over the optically effective surface. The retardation can be, in particular, lambda/2 or lambda/4, where lambda denotes the operating wavelength of the optical system.

In accordance with one embodiment, the polarization-influencing optical element has a wedge-section-shaped geometry. This configuration, too, similarly to the configuration having plane-parallel geometry, has the advantage of particularly simple and thus comparatively cost-effective producibility.

In accordance with one embodiment, the polarization-influencing optical element is produced from optically active material.

In accordance with one embodiment, the optical system furthermore has a compensator element having a geometry complementary to the polarization-influencing optical element in order to compensate for a ray deflection brought about by the polarization-influencing optical element.

In accordance with one embodiment, the optical system furthermore has a polarization-influencing optical arrangement composed of a plurality of optical components which are adjustable relative to one another with a degree of overlap that is variable in the light propagation direction, wherein different output polarization distributions can be generated by this adjustment in conjunction with the mirror arrangement and the polarization-influencing optical element.

The use of such an additional polarization-influencing optical arrangement has—as explained in even greater detail below—firstly the consequence that in conjunction with the polarization-influencing optical element, for a range of different directions of polarization that is ultimately desired in a pupil plane, it is no longer necessary for the polarization-influencing optical element itself (for instance on account of a specific wedge angle) to completely provide the respective angular range, since it suffices if the required range of polarization rotation angles is covered in combination with the additional polarization rotation brought about by the polarization-influencing optical arrangement. A further advantage is that—as will likewise be explained in even greater detail— it is also possible to set polarized illumination settings with illuminated regions spatially separated from one another in the pupil plane (e.g. dipole or quadrupole illumination settings) with desired (e.g. quasi-tangential) polarization distribution substantially without loss of light.

In accordance with one embodiment, different polarization rotation angles of the preferred direction of polarization of light passing through can be set by this adjustment.

The polarization rotation angles can correspond in particular to an integral multiple of 22.5°, in particular an integral multiple of 45°.

In accordance with one embodiment, a polarization rotation angle produced by the polarization-influencing optical element over the light beam cross section is a maximum of 45°.

In accordance with one embodiment, the output polarization distribution in at least one configuration of the mirror arrangement and of the polarization-influencing optical element is an at least approximately tangential polarization distribution or an at least approximately radial polarization distribution.

In accordance with one embodiment, an illumination setting generated in a pupil plane of the optical system is an annular illumination setting, a dipole illumination setting or a quadrupole illumination setting.

The invention furthermore relates to a microlithographic projection exposure apparatus, and to a method for microlithographically producing microstructured components.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIGS. 7*a-f* show schematic illustrations for elucidating the construction and the functioning of an optical system according to the invention having an additional polarization-influencing optical arrangement.

DETAILED DESCRIPTION OF PREFERRED EMBODIMENTS

Figure 8:
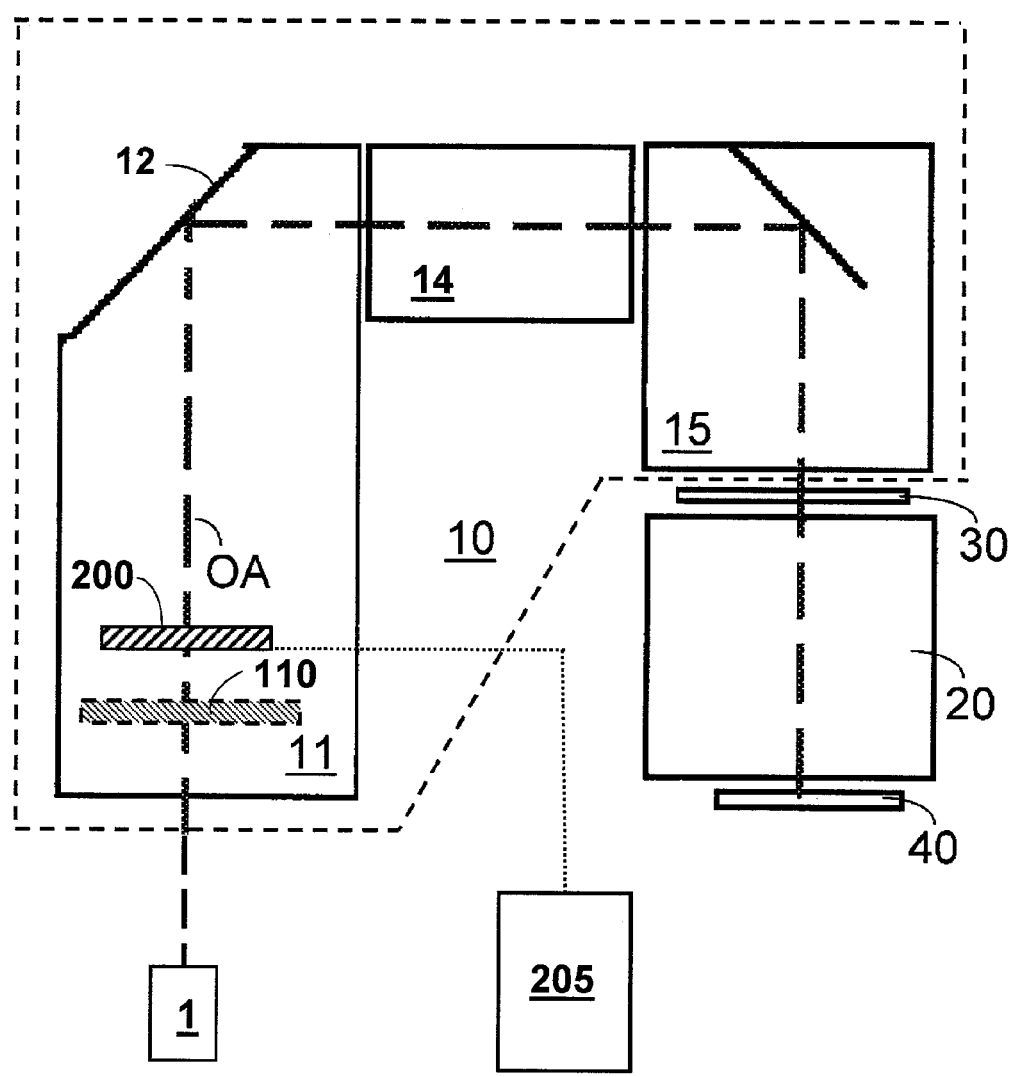
FIG. 8 shows a schematic illustration for elucidating the construction of a microlithographic projection exposure apparatus having a polarization-influencing optical element in accordance with one embodiment of the invention.

Hereinafter, a basic construction of a microlithographic projection exposure apparatus comprising an optical system according to the invention will firstly be explained with reference to FIG. 8. The projection exposure apparatus comprises an illumination device 10 and a projection lens 20. The illumination device 10 serves for illuminating a structure-bearing mask (reticle) 30 with light from a light source unit 1, which comprises, for example, an ArF excimer laser for an operating wavelength of 193 nm and a beam shaping optical unit, which generates a parallel light beam. Generally, the illumination device 10 and the projection lens 20 are preferably designed for an operating wavelength of less than 400 nm, in particular less than 250 nm, more particularly less than 200 nm.

According to the invention, part of the illumination device 10 is, in particular, a mirror arrangement 200, as will be explained in greater detail below with reference to FIG. 2. The mirror arrangement 200 has a plurality of mirror elements which are adjustable independently of one another for the purpose of changing an angular distribution of the light reflected by the mirror arrangement 200, in accordance with FIG. 1, provision can be made of a driving unit 205 for driving this adjustment (e.g. via suitable actuators).

A polarization-influencing optical arrangement 110, which will be explained in even greater detail below with reference to FIG. 1 et seq., is arranged upstream of the mirror arrangement 200 in the light propagation direction.

The illumination device 10 has an optical unit 11, which comprises a deflection mirror 12 inter alia in the example illustrated. Downstream of the optical unit 11 in the light propagation direction there are situated in the beam path a light mixing device (not illustrated), which can have, for example, in a manner known per se, an arrangement of micro-optical elements suitable for achieving light mixing, and a lens element group 14, downstream of which is situated a field plane with a reticle masking system (REMA), which is imaged, by a REMA lens 15 disposed downstream in the light propagation direction, onto the structure-bearing mask (reticle) 30 arranged in a further field plane and thereby delimits the illuminated region on the reticle. The structure-bearing mask 30 is imaged by the projection lens 20 onto a substrate 40, or a wafer, provided with a light-sensitive layer. The projection lens 20 can be designed, in particular, for immersion operation. Furthermore, it can have a numerical aperture NA of greater than 0.85, in particular greater than 1.1.

Firstly, a first embodiment of a polarization-influencing optical element 110 according to the invention and the interaction thereof with the mirror arrangement 200 are elucidated below with reference to FIG. 1.

Figure 1:
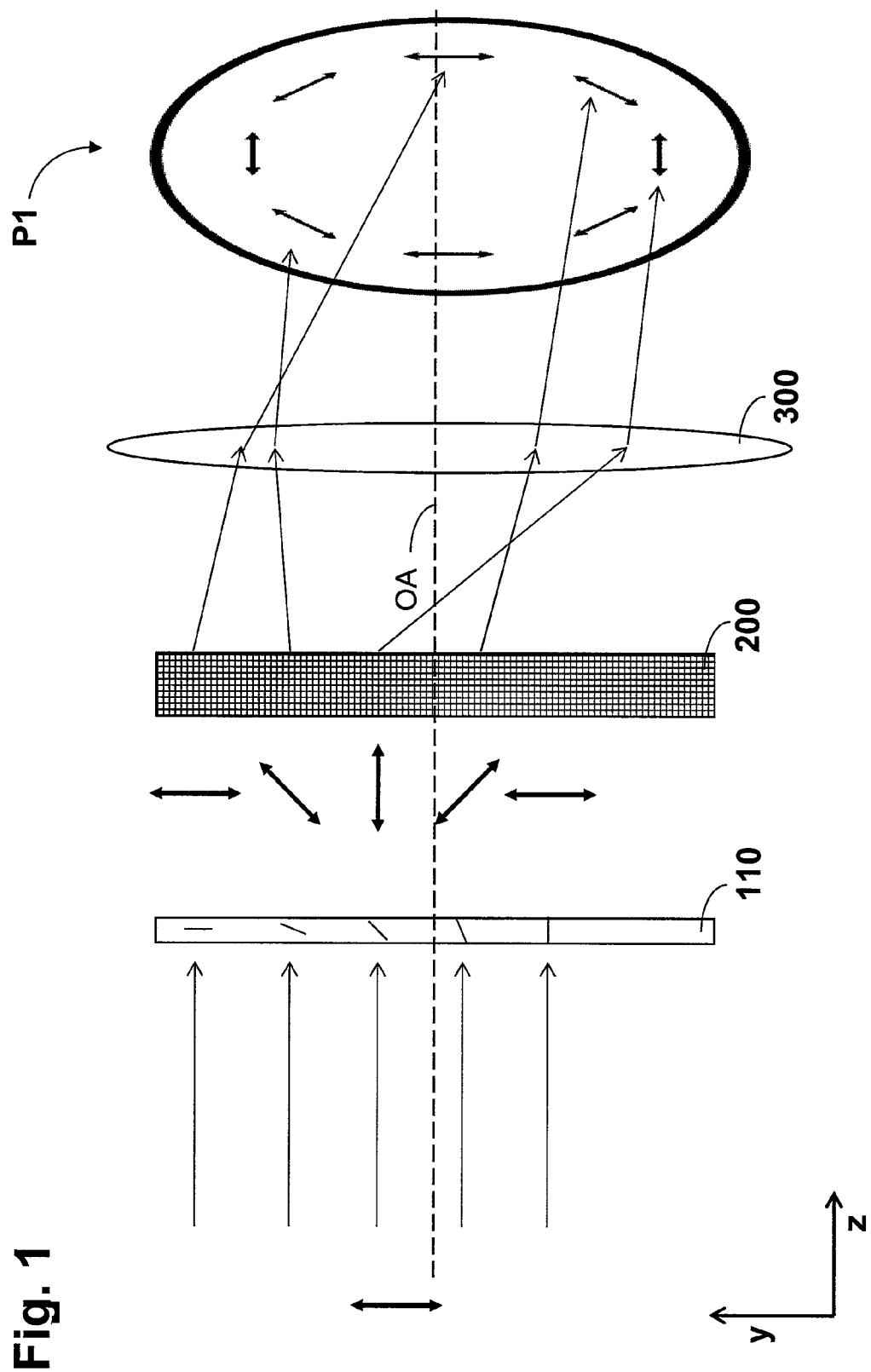
FIG. 1 shows a schematic illustration for elucidating the construction and the functioning of an optical system in accordance with one embodiment of the invention.
Figure 2:
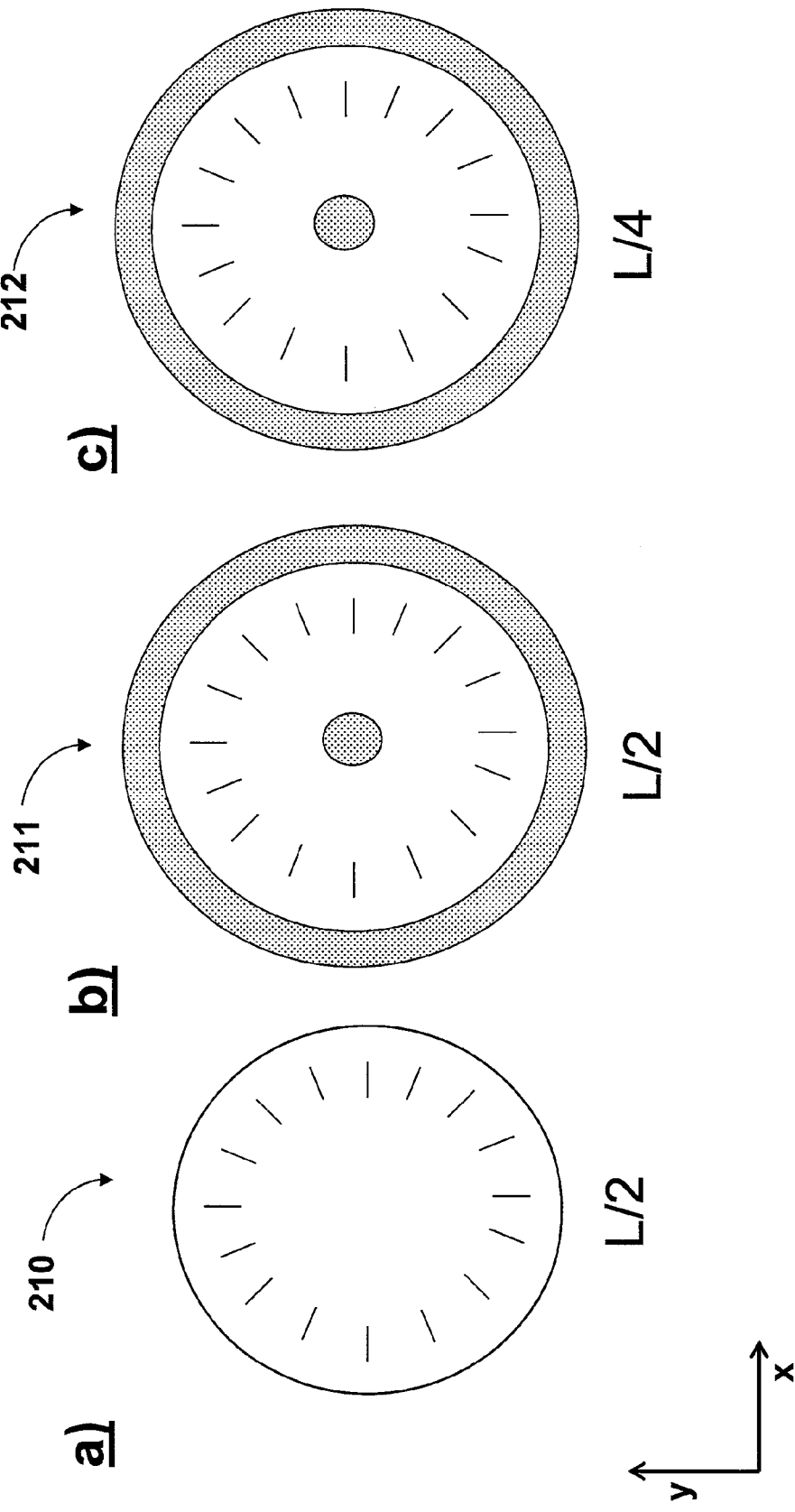
FIGS. 2*a-c* show schematic illustrations for elucidating different embodiments of a polarization-influencing optical element used in the optical system from FIG. 1.

The polarization-influencing optical element 110 in accordance with FIG. 1 has linear birefringence having a birefringence distribution, wherein the absolute value of the birefringence over the optically effective surface of the element 110 in the exemplary embodiment has the constant value of lambda/2 (where lambda denotes the operating wavelength of the optical system), and wherein the direction of the fast axis (indicated by short lines) of the birefringence varies continuously over the optically effective surface, as will be explained in even greater detail below with reference to FIG. 2a-c.

In the specific exemplary embodiment, the polarization-influencing optical element 110 is a plane-parallel plate composed of quartz glass ($SiO_2$), wherein the linear birefringence distribution was generated via stress birefringence by external mechanical pressure being applied to the plate. Furthermore, as illustrated schematically in FIG. 2a, the linear birefringence distribution generated by the external pressure has in the exemplary embodiment an azimuthal profile with respect to the optical system axis OA (running in the z-direction in the coordinate system depicted).

In a further exemplary embodiment, illustrated in FIG. 2b, such a linear birefringence distribution can also be generated by radiation-induced defects being produced in an optically unused region. This method is based on the insight that by irradiating an amorphous material such as e.g. quartz glass ($SiO_2$) with, in particular, infrared radiation in a targeted manner, it is possible to produce a linear birefringence brought about by the radiation-induced defects in the material, the birefringence also being formed in the regions not directly irradiated, with the result that the radiation-induced defects can also be produced in a region not used optically at all. In this case, via suitable arrangement of the radiation-induced defects, the local distribution of the fast axis of birefringence that arises here can be set in a targeted manner. In this context, studies undertaken have revealed that e.g. values of the retardation (i.e. the difference in the optical path lengths for mutually orthogonal or perpendicular polarization states) of more than 10 nm per centimeter of material path can be set with high accuracy. If the operating wavelength is approximately 193 nm, for example, a retardation of lambda/2 corresponds to approximately 96.5 nm and thus to a required material path of less than 9 cm, which can be provided by one or else a plurality of the polarization-influencing optical elements 101 illustrated.

In accordance with FIG. 2b it is possible (without the invention being restricted thereto) to implement the above-described production of radiation-induced defects in a central or radially inner first region and a radially outer annular second region, in order to generate the desired linear birefringence in the intervening region.

Referring to FIG. 1 again, the polarizing-influencing optical element 110 brings about for light passing through, on account of the linear birefringence distribution described above, a rotation of the originally constantly linear input polarization, the rotation varying continuously over the optical active surface of the element 110, the respective vibration direction of the electric field strength vector being symbolized merely schematically by double-headed arrows in FIG. 1.

The light emerging from the polarization-influencing optical element 110 then impinges on the mirror arrangement 200 and is reflected at different angles depending on the tilting position of the respective mirror elements and is directed via a downstream Fourier optical unit 300 into the pupil plane of the illumination device, the tangential polarization distribution generated there being designated by P1 and indicated schematically in FIG. 1.

In a further exemplary embodiment (not illustrated), the polarization-influencing optical element 110 can also be arranged downstream of the mirror arrangement 200 in the light propagation direction.

Figure 3:
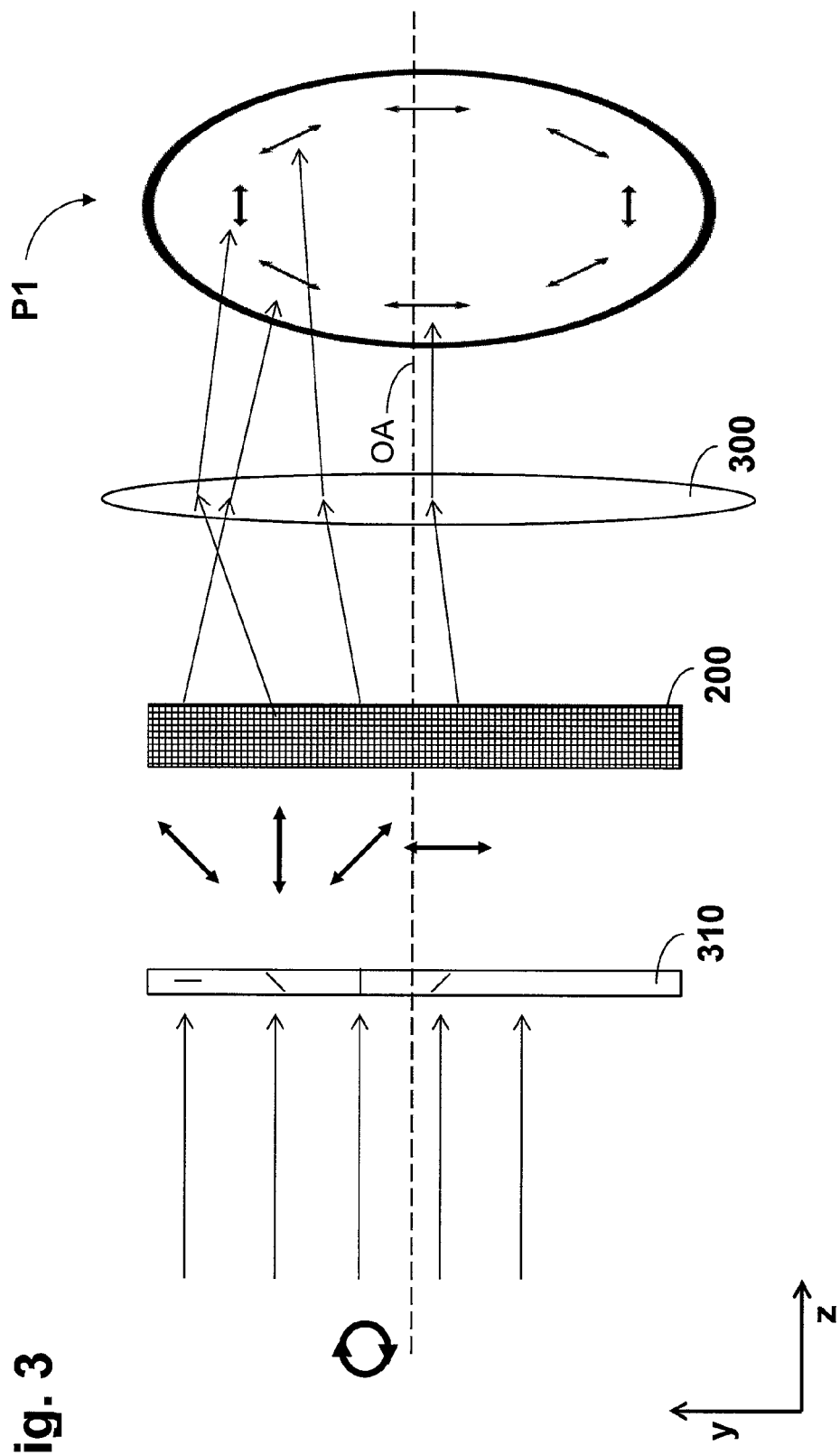
FIGS. 3-6 show schematic illustrations for elucidating further embodiments of an optical system according to the invention.

The invention is not restricted to the constantly linear input polarization of the light impinging on the polarization-influencing optical element 110, as chosen in the exemplary embodiment in FIG. 1. In a further exemplary embodiment, illustrated in FIG. 3 and FIG. 2c, generation analogous to FIG. 1 of a desired (in particular once again tangential), output polarization distribution can also be generated from a circular input polarization (indicated schematically in FIG. 3), wherein in this case the polarization-influencing optical element 310 has an absolute value (once again constant over the optically effective surface) of the birefringence of lambda/4, and wherein the direction of the fast axis of this birefringence (likewise analogously to the embodiment described with reference to FIG. 1) varies in an azimuthal direction relative to the optical system axis OA. This is illustrated schematically in FIG. 2c, wherein the relevant birefringence distribution is brought about here analogously to FIG. 2b once again by the production of radiation-induced defects in an optically unused region. In a further exemplary embodiment (not illustrated), this birefringence distribution can also be brought about via a stress birefringence generated by application of external pressure in a manner analogous to FIG. 2a.

Figure 4:
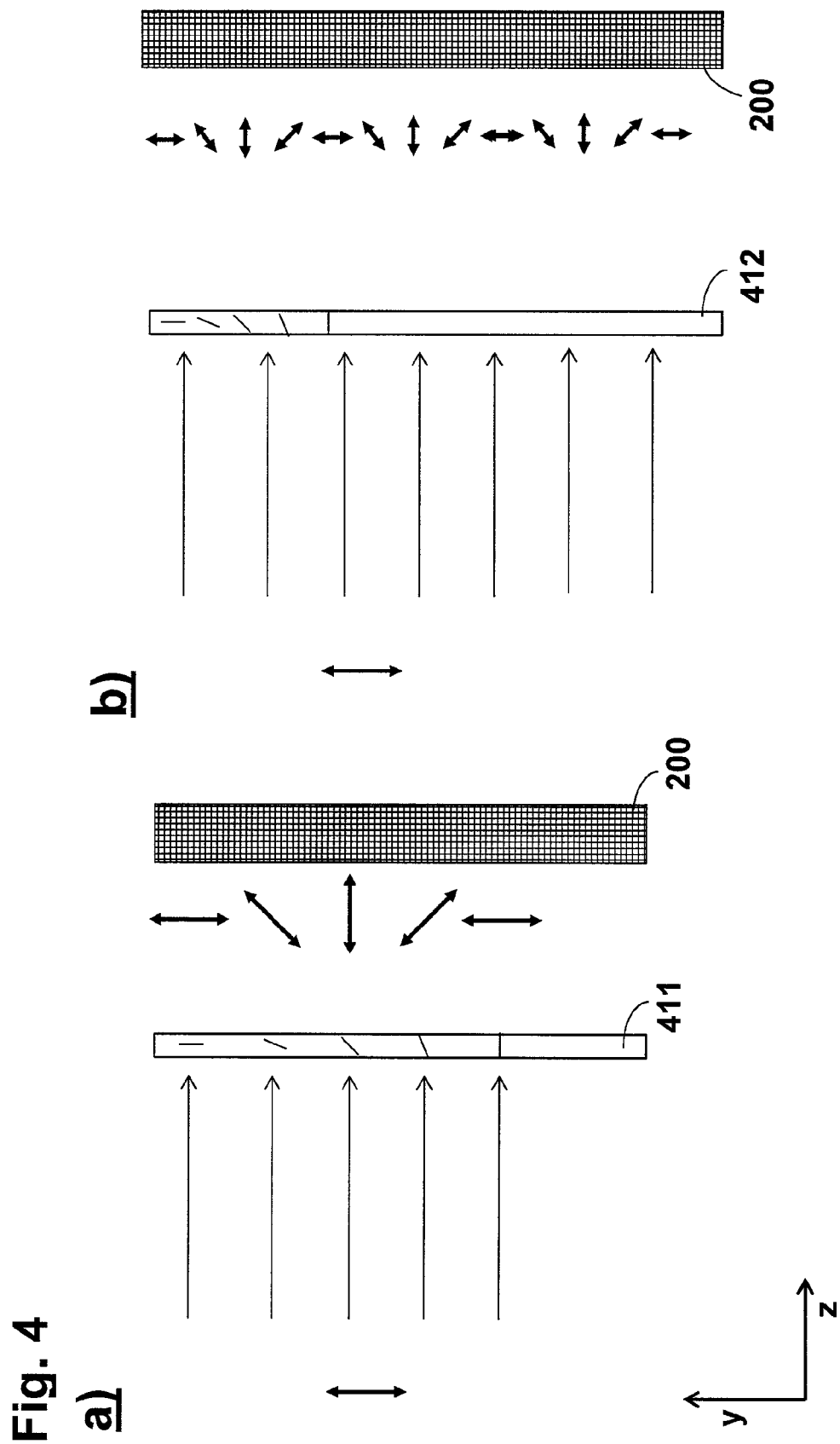

As far as the period of the variation of the fast axis of birefringence over the optically effective surface of the polarization-influencing optical element is concerned, this period can correspond to the size of the mirror arrangement 200 in accordance with FIG. 4a for one exemplary element 411 depicted, or else can be smaller than the size of the mirror arrangement 200 in accordance with FIG. 4b for a different polarization-influencing optical element 412.

A further embodiment of a polarization-influencing optical element 510 and the interaction thereof with the mirror arrangement 200 are described below with reference to FIG. 5.

Figure 5:
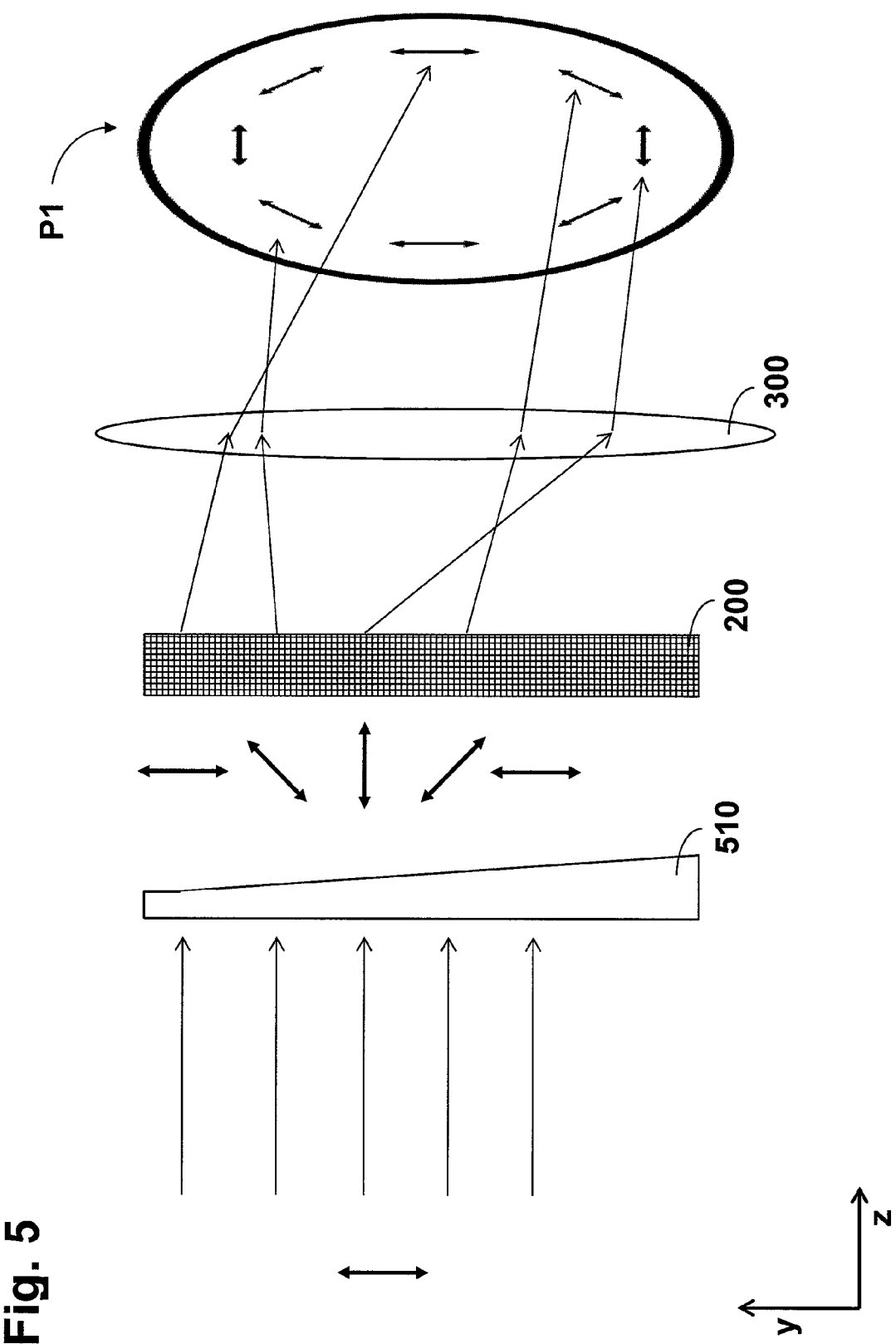
Figure 6:
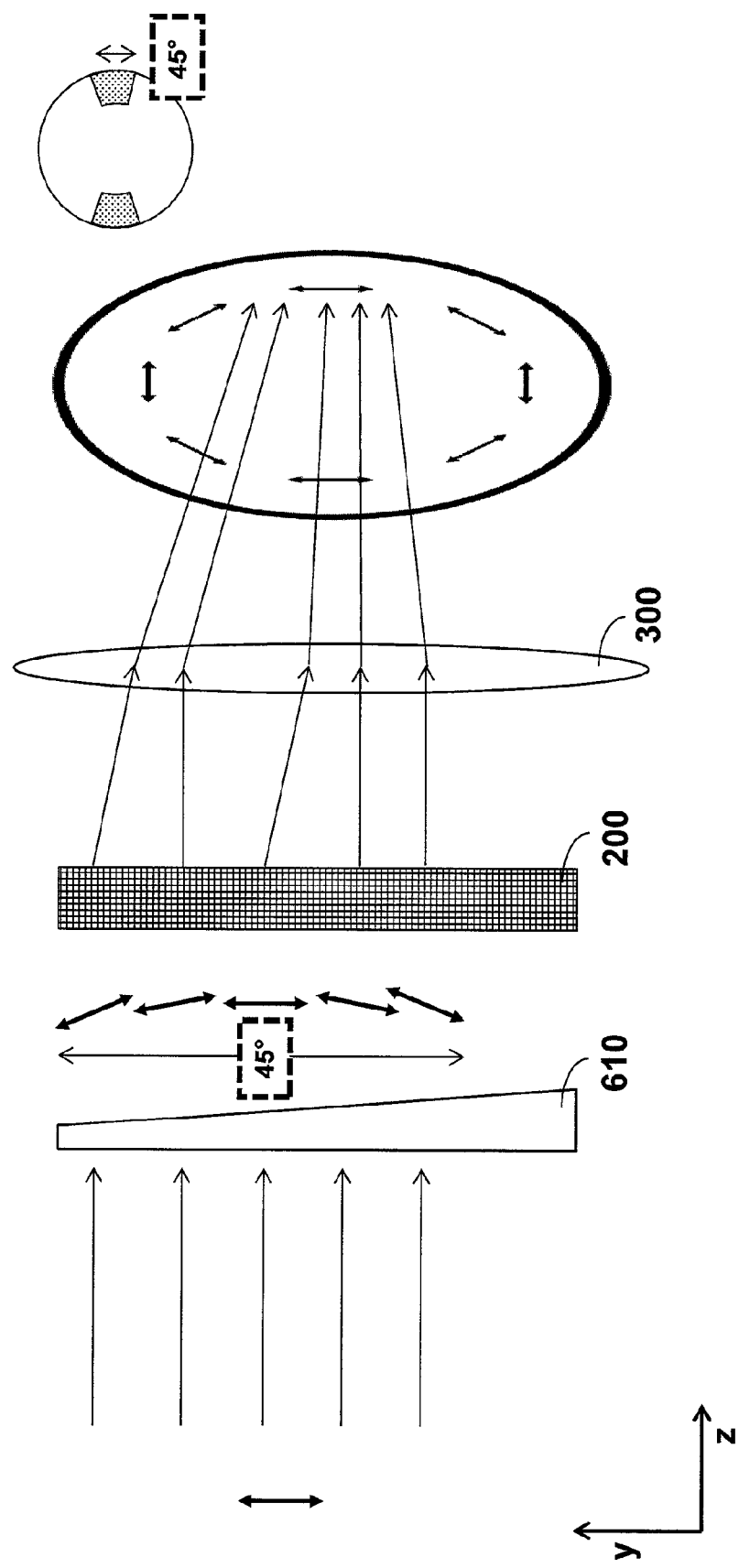

In accordance with FIG. 5, a polarization-influencing optical element 510 has a wedge-section-shaped geometry and is produced from optically active material (in the exemplary embodiment from crystalline quartz having an orientation of the optical crystal axis that is parallel to the optical system axis OA or z-direction). In this case, too, in a modification of the arrangement from FIG. 5, the polarization-influencing optical element 510 can alternatively also be arranged downstream of the mirror arrangement 200 in the light propagation direction.

As indicated once again with the aid of double-headed arrows in FIG. 5, the element 510 brings about for originally constantly linearly polarized light passing through, on account of the optical activity, a polarization rotation by a polarization rotation angle proportional to the thickness of the optically active material through which the light passes. Consequently, for the light emerging from the element 510, a continuously varying direction of polarization arises once again analogously to FIG. 1, wherein—likewise analogously to FIG. 1—upon subsequent impingement on the mirror elements of the mirror arrangement 200 correspondingly differently polarized light channels are directed via the downstream Fourier optical unit 300 into the pupil plane depending on the tilting angle of the mirror elements of the mirror arrangement 200.

As a result, in accordance with the exemplary embodiment in FIG. 5, a tangential polarization distribution P1 is once again generated in the pupil plane.

A further embodiment of the invention is elucidated below with reference to FIG. 6 and FIGS. 7a to 7f.

The construction in accordance with FIGS. 7a to 7f differs from that from FIG. 5 in that in addition to a polarization-influencing optical element 710 produced from optically active material in a wedge-section-shaped manner and the mirror arrangement 200, a further polarization-influencing optical arrangement composed of a plurality of optical components 751, 752 and 753 is provided, the optical components being adjustable relative to one another with a degree of overlap that is variable in the light propagation direction (i.e. z-direction).

In the specific exemplary embodiment, the relevant components 751, 752 and 753 are likewise produced from optically active material (in particular crystalline quartz having a direction of the optical crystal axis that runs parallel to the optical system axis OA), wherein each of the components 751-753 has a plane-parallel geometry having a thickness such that the direction of polarization for linearly polarized impinging light is rotated by an angle of 45° upon passing through a respective one of the components. Consequently, depending on the degree of overlap of the components 751-753, for a light beam respectively passing through, a polarization rotation angle of 90° arises upon passing through two components, and a polarization rotation angle of around 135° upon passing through three components.

Figure 7A:
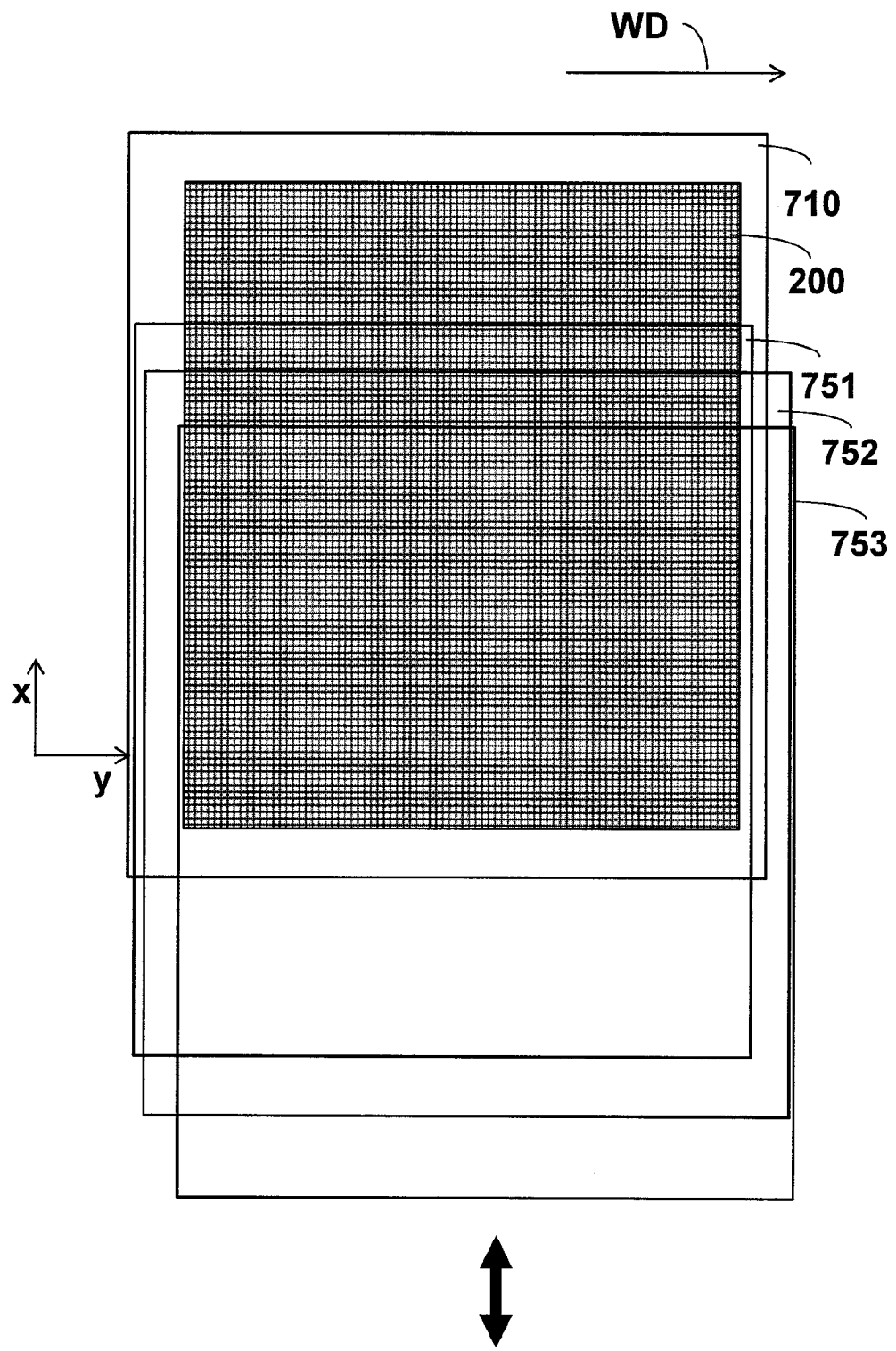
Figure 7D:
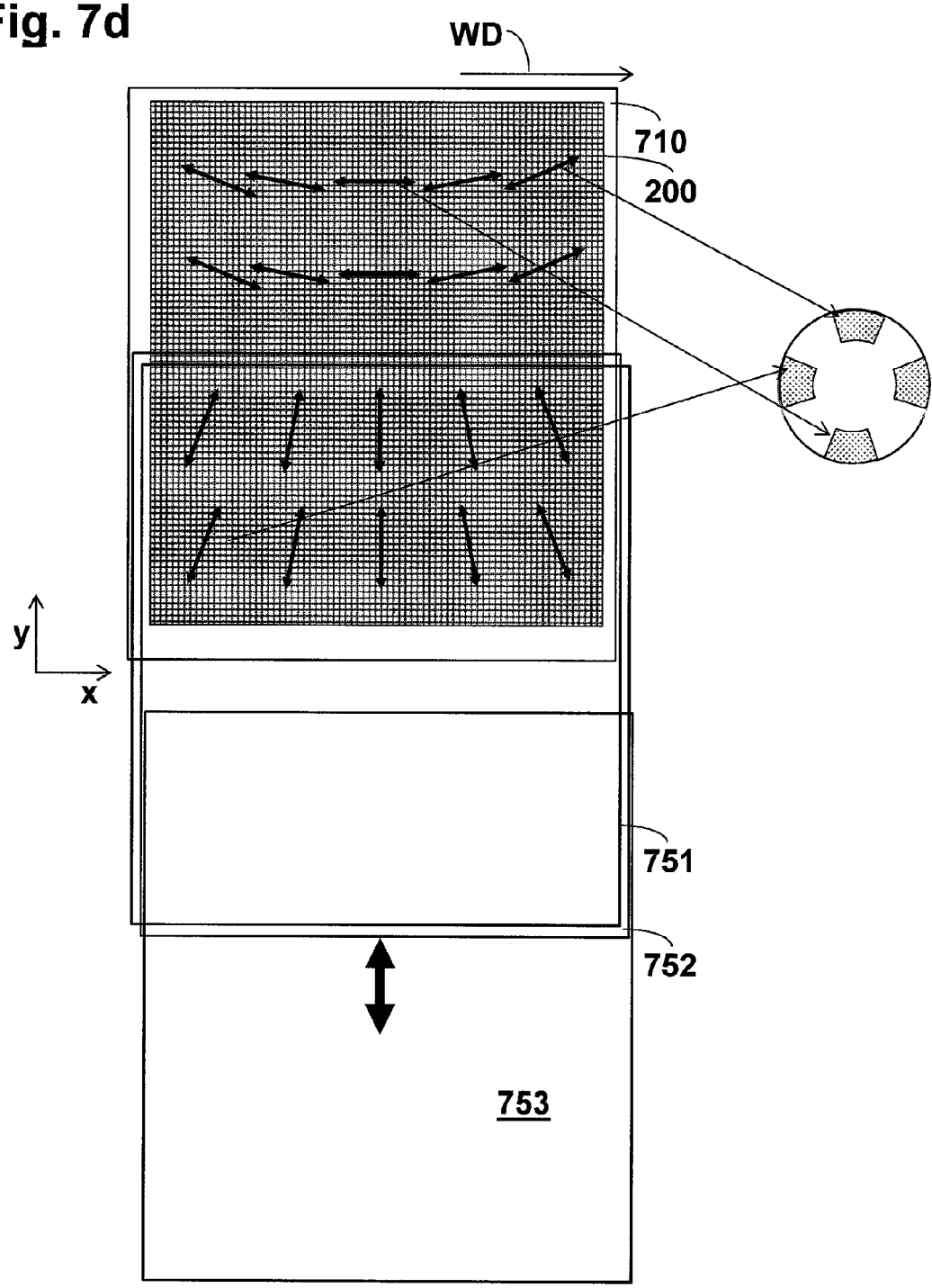

As is then indicated in FIG. 7b-f, different polarized illumination settings can be set by varying the position of the components 751, 752 and 753 of the polarization-influencing optical arrangement in conjunction with the polarization-influencing optical element 710 and the mirror arrangement 200, wherein merely by way of example FIG. 7b indicates the production of a dipole illumination setting having illumination poles (having x-polarization in each case) opposite one another in the y-direction, FIG. 7c indicates the production of a dipole illumination setting having illumination poles (having y-polarization in each case) opposite one another in the x-direction, FIG. 7d indicates the production of a quadrupole illumination setting (having x-y-polarization), FIG. 7e indicates the production of a quasar illumination setting having a direction of polarization oriented at 45° with respect to the x- and y-direction, respectively, and FIG. 7f indicates the production of an annular illumination setting having tangential polarization. In this case, the illumination settings in FIG. 7b-e can be designated in each case as quasi-tangentially polarized illumination settings.

The additional polarization rotation that can be set flexibly via the polarization-influencing optical arrangement 750 firstly has the consequence that in conjunction with the polarization-influencing optical element 710 (the wedge direction of which is indicated by an arrow designated by "WD" in FIG. 7a-7f), for a range of different directions of polarization that is ultimately desired in the pupil plane, it is no longer necessary for the polarization-influencing optical element 710 itself to completely provide the respective angular range on account of its wedge angle.

In the specific exemplary embodiment this means that a maximum polarization rotation—arising over the extent of the polarization-influencing optical element 710—of 45° is sufficient to cover, in combination with the above-described additional polarization rotation on account of the polarization-influencing optical arrangement by 45°, 90° or 135°, a continuous range of polarization rotation angles of from 0° to 180° in the pupil plane. This is indicated in the schematic illustration in FIG. 6 (the components 751, 752 and 753 of the polarization-influencing optical arrangement not being illustrated here, for the sake of clarity).

The embodiment described above with reference to FIG. 7a-7f has the further advantage that it is also possible to set polarized illumination settings having illuminated regions spatially separated from one another in the pupil plane (e.g. dipole or quadrupole illuminated settings) with a desired (e.g. quasi-tangential) polarization distribution substantially without loss of light. This advantage results from the fact that, in contrast to the embodiments described with reference to FIG. 1-5, not every polarization state is necessarily generated to the same proportion from the outset.

In the embodiment described above with reference to FIG. 7a-7f, i.e. in the case of the configuration both of the components 751, 752 and 753 of the polarization-influencing optical element and of the polarization-influencing optical element 710 from optically active material (in particular crystalline quartz having a direction of the optical crystal axis that runs parallel to the optical system axis OA), the order of the components 751, 752 and 753 of the polarization-influencing optical arrangement and of the polarization-influencing optical element 710 and of the mirror arrangement 200 along the optical system axis OA or the light propagation direction (z-direction) is arbitrary in principle.

However, the concept described above with reference to FIG. 7a-7f is not restricted to the components 751 to 753 of the polarization-influencing optical arrangement being realized from optically active material. In further embodiments, these components—in combination with the configuration of the polarization-influencing optical element from optically active crystal material (i.e. analogously to FIG. 5)—can also be embodied with the use of linear birefringence or as retarders (in particular as lambda/2 plates), wherein in this case the components 751-753 are positioned upstream of the polarization-influencing optical element relative to the light propagation direction, in order that a varying direction of polarization is not already present when light enters into the components 751-753.

Furthermore, the configuration of the polarization-influencing optical element 710—in combination with the configuration of the components 751 to 753 of the polarization-influencing optical arrangement from optically active material—in a departure from the exemplary embodiment described above, can also be implemented analogously to FIG. 1, i.e. with the use of linear birefringence having a varying direction of the fast axis of the birefringence distribution.

In the embodiment described above with reference to FIG. 7a-7f, i.e. in the case of the configuration both of the components 751, 752 and 753 of the polarization-influencing optical arrangement and of the polarization-influencing optical element 710 from optically active material (in particular crystalline quartz having a direction of the optical crystal axis that runs parallel to the optical system axis OA), the order of the components 751, 752 and 753 of the polarization-influencing optical arrangement and of the polarization-influencing optical element 710 and of the mirror arrangement 200 along the optical system axis OA or the light propagation direction (z-direction) is arbitrary in principle.

In further configurations of the invention, in the optical system according to the invention, in each of the embodiments described above, it is also possible to use an additional rotator (e.g. a 90° rotator or a 45° rotator) for producing an additional (global) rotation of the direction of polarization of the light generated by the light source, in order to obtain, if appropriate, further optimization of the performance of the optical system depending on the specific application situation.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system, comprising:
   a mirror arrangement comprising a plurality of mirror elements, the plurality of mirror elements being adjustable independently relative to each other to change an angular distribution of light reflected by the mirror arrangement; and
   a polarization-influencing optical element configured so that, when light having a constantly linear polarization distribution or a circular input polarization distribution impinges on the polarization-influencing optical element, the polarization-influencing optical element generates a light beam having an output polarization distribution with a direction of polarization that varies continuously over a cross-section of the light beam,
   wherein:
      the polarization-influencing optical element has a geometry selected from the group consisting of a plane-parallel geometry and a wedge-section-shaped geometry; and
      the optical system is a microlithographic optical system.

2. The optical system of claim 1, wherein the polarization-influencing optical element has a plane-parallel geometry.

3. The optical system of claim 1, wherein the polarization-influencing optical element has linear birefringence with a direction of a fast axis of birefringence that varies over an optically effective surface of the polarization-influencing optical element.

4. The optical system of claim 3, wherein the optical system has an optical system axis, and the direction of the fast axis of birefringence of the polarization-influencing optical element varies in an azimuthal direction with respect to the optical system axis.

5. The optical system of claim 1, wherein the polarization-influencing optical element has a retardation with a constant absolute value over an optically effective surface of the polarization-influencing optical element.

6. The optical system of claim 5, wherein the retardation is lambda/2, and lambda is an operating wavelength of the optical system.

7. The optical system of claim 5, wherein the retardation is lambda/4, and lambda is an operating wavelength of the optical system.

8. The optical system of claim 1, wherein the polarization-influencing optical element has a wedge-section-shaped geometry.

9. The optical system of claim 8, wherein the polarization-influencing optical element comprises an optically active material.

10. The optical system of claim 8, further comprising a compensator element having a geometry which is complementary to the geometry of the polarization-influencing optical element to compensate for a ray deflection caused by the polarization-influencing optical element.

11. The optical system of claim 1, wherein the polarization-influencing optical element comprises an optically active material.

12. The optical system of claim 8, further comprising a compensator element having a geometry which is complementary to the geometry of the polarization-influencing optical element to compensate for a ray deflection caused by the polarization-influencing optical element.

13. The optical system of claim 1, further comprising a compensator element having a geometry which is complementary to the geometry of the polarization-influencing optical element to compensate for a ray deflection caused by the polarization-influencing optical element.

14. The optical system of claim 1, further comprising a polarization-influencing optical arrangement comprising a plurality of optical components that are adjustable relative to each other with a degree of overlap that is variable in a propagation direction of the light, wherein the optical system is configured so that, in conjunction with the mirror arrangement and the polarization-influencing optical element, different output polarization distributions are generated by adjusting of the degree of overlap of the optical components.

15. The optical system of claim 14, wherein the optical system is configured so that the adjustment sets different polarization rotation angles of a preferred direction of polarization of light passing through the polarization-influencing optical arrangement.

16. The optical system of claim 15, wherein polarization rotation angles correspond to an integral multiple of 22.5°.

17. The optical system of claim 15, wherein polarization rotation angles correspond to an integral multiple of 45°.

18. The optical system of claim 1, wherein the optical system is configured so that a polarization rotation angle produced by the polarization-influencing optical element over the light beam cross section is a maximum of 45°.

19. The optical system of claim 1, wherein the optical system is configured so that the output polarization distribution in at least one configuration of the mirror arrangement and the polarization-influencing optical element is an at least approximately tangential polarization distribution or an at least approximately radial polarization distribution.

20. The optical system of claim 1, wherein the optical system is configured so that an illumination setting generated in a pupil plane of the optical system is selected from the group consisting of an annular illumination setting, a dipole illumination setting and a quadrupole illumination setting.

21. An apparatus, comprising:
   an illumination device comprising an optical system; and
   a projection lens,
   wherein:
      a member comprises an optical system according to claim 19;
      the member comprises a member selected from the group consisting of the illumination system and the projection objective; and
      the apparatus is a microlithographic projection exposure apparatus.

22. A method of operating a microlithographic projection exposure apparatus which comprises an illumination device and a projection objective, the method comprising:
   using the illumination device to illuminate structures of a mask;

using the projection objective to project at least a portion of the illuminated structures onto a light-sensitive material, wherein:
a member comprises an optical system according to claim 19;
the member comprises a member selected from the group consisting of the illumination system and the projection objective.

23. The optical system of claim 1, wherein:
the polarization-influencing optical element has a first surface and a second surface that are on the opposite side of the polarization-influencing optical element;
the polarization-influencing optical element is configured so that, during use of the optical system, the light having a constantly linear polarization distribution or a circular input polarization distribution impinges on the first surface of the polarization-influencing optical element; and
the polarization-influencing optical element is configured so that, during use of the optical system, the light beam having the output polarization distribution with the direction of polarization that varies continuously over the cross-section of the light beam emerges from the second surface of the polarization-influencing optical element.

24. The optical system of claim 1, wherein the polarization-influencing optical element comprises quartz.

* * * * *